US008351473B1

(12) United States Patent
Darcie et al.

(10) Patent No.: US 8,351,473 B1
(45) Date of Patent: Jan. 8, 2013

(54) SYSTEM AND METHOD FOR LASER WAVELENGTH CONTROL

(75) Inventors: Thomas E. Darcie, Victoria (CA); Neil Barakat, Victoria (CA); Jinye Zhang, Victoria (CA)

(73) Assignee: UVic Industry Partnerships Inc., Victoria, B.C. (CA)

( * ) Notice: Subject to any disclaimer, the term of this patent is extended or adjusted under 35 U.S.C. 154(b) by 366 days.

(21) Appl. No.: 12/626,791

(22) Filed: Nov. 27, 2009

Related U.S. Application Data

(60) Provisional application No. 61/118,455, filed on Nov. 27, 2008.

(51) Int. Cl.
*H01S 3/10* (2006.01)
(52) U.S. Cl. ........... 372/20; 372/25; 372/29.01; 372/32; 372/38.01
(58) Field of Classification Search .................... 372/20, 372/25, 29.01, 32, 38.01
See application file for complete search history.

(56) References Cited

U.S. PATENT DOCUMENTS

| 6,518,563 | B1 * | 2/2003 | Broutin et al. ................. 250/226 |
| 6,895,025 | B2 * | 5/2005 | Herble et al. ....................... 372/9 |
| 7,139,295 | B2 * | 11/2006 | Tsai et al. ......................... 372/20 |
| 2005/0094680 | A1 * | 5/2005 | Takabayashi et al. .......... 372/20 |
| 2006/0268947 | A1 * | 11/2006 | Kalayeh ........................... 372/20 |
| 2012/0162659 | A1 * | 6/2012 | Goldberg et al. ............. 356/479 |

* cited by examiner

*Primary Examiner* — Jessica Stultz
*Assistant Examiner* — Delma R Forde
(74) *Attorney, Agent, or Firm* — Klarquist Sparkman, LLP

(57) ABSTRACT

Disclosed are systems and methods for improving wavelength control in tunable laser sources. Embodiments of the systems and methods include delivering a fraction of the light output from the laser to an optical filter subsystem. The optical filter subsystem is capable of outputting at least one filter response signal, and comprises 2 complementary optical etalon filters with nominally identical free spectral ranges but offset by nominally one third of the free spectral range. The filter response signal is processed in a control unit which executes a control algorithm to generate a tuning signal that is used to control the wavelength of the laser.

14 Claims, 2 Drawing Sheets

SYSTEM AND METHOD FOR LASER WAVELENGTH CONTROL

CROSS-REFERENCE TO RELATED APPLICATION

This application claims the benefit of U.S. Provisional Application 61/118,455, filed Nov. 27, 2008, which is incorporated herein by reference.

FIELD OF INVENTION

This invention relates to wavelength control of lasers for applications and instrumentation and optical communications.

BACKGROUND

Diode lasers are important in a wide variety of applications in optical communications, science, biophotonics, and many other areas. In an increasing number of applications, it is important to know the laser frequency with high precision. These applications include dense wavelength-division multiplexed (DWDM) optical communications, where the optical frequency must be controlled to typical 1-2 GHz. Systems using coherent optical detection require two laser with frequencies matched to at least sub-GHz accuracy. A variety of techniques for generating high-frequency microwave or terahertz radiation involve mixing together two wavelength-controlled lasers, and the resulting frequency is only as accurate as the control of the optical frequencies. For these applications and more it is important to be able to control the absolute wavelength of a diode laser source with a precision in the order of less than 10 MHz.

Most of the important applications discussed herein require single-frequency (distributed feedback (DFB) or distributed Bragg reflector (DBR)) lasers, but the methods disclosed are applicable to all types of diode lasers. Wavelength generally must be controlled actively, since the laser wavelength depends on device temperature and output power (which is proportional to the injection current), and this dependence changes as the laser ages. Active control is accomplished by measuring the laser wavelength and adjusting the laser temperature by means of a thermoelectric cooler (TEC).

A variety of methods exist to measure the wavelength of a laser diode. Wavelength meters operate by counting fringes in an optical interferometer. While highly precise, these instruments require mechanical parts to scan the interference pattern; hence they are too large and expensive for many applications. A scanning Fabry-Perot (FP) interferometer is a common device used for accurate frequency measurement. However, these are expensive, difficult to align, and require careful calibration with a known frequency source to provide absolute frequency measurement. Fiber FPs have been developed to offset cost issues somewhat, but these still lack absolute wavelength measurement. We seek a low-cost solution with absolute measurement capability.

It is well known that a wide variety of optical filters with fully characterized transfer functions (transmission or reflection versus wavelength) can be used to provide absolute frequency measurement. A variety of slope filters have been manufactured using, for example, thin film multilayer coatings to provide an approximately linear transfer function over a targeted range of wavelengths. The output signal then corresponds to a unique input wavelength. Since these can be made from materials (e.g., fused silica) with low thermal dependence, they can provide good thermal stability and temperature dependence that can be corrected easily. However, the accuracy of the wavelength control depends on the slope of the transfer function relative to the noise (noise from optical detection and from digital sampling) in the output signal. For wavelength tuning over a wide range, this slope becomes small, and the accuracy of wavelength control is impaired. We require the maximum possible accuracy; therefore this limited slope is unacceptable. In addition, a different filter is required for each operating range. This complicates supply and inventory management, as many different parts must be ordered, and this increases cost.

In optical communications systems using dense wavelength-division multiplexing (DWDM) wavelengths must be controlled to align the standard ITU frequency plan. Channels by this plan are defined on a periodic frequency grid with 100, 50, or 25 GHz frequency spacing. A typical DFB laser can be temperature tuned typically over several channels. To lock a laser to the center wavelength of an ITU channel, wavelength lockers have been developed. These generally consist of a Fabry-Perot etalon, made using thin-film multilayer dielectric minors. The mirror reflectivities are designed to produce resonances with a reasonably sinusoidal transfer function. While the exact peak of the FP resonances is angle and temperature dependent, the desired periodicity (100, 50, or 25 GHz) can be fabricated with high precision. Wavelength control is accomplished by locking the laser to the steep slope of the transfer function, where the transmission is typically in the middle between the maximum and the minimum. This provides a low-cost and accurate method for locking to discrete, specific, and periodic channels. However, the periodicity of the etalon transfer function causes ambiguity in wavelength measurement. Also, the measurement accuracy is decreased as the optical wavelength under measurement falls within the range around the maxima and minima (tops and bottoms) of the transfer function where the slope is decreased. Additionally, the accuracy at the bottoms is degraded more than that at the tops due to lower signal-to-noise ratio around the minima. Thus the use of a single etalon is not a suitable technique for precise wavelength determination over a wide wavelength range.

The measurement ambiguity due to the periodic transfer function of an optical etalon can be circumvented by adding a coarse wavelength determination method, as long as this method has a wavelength resolution no larger than the FSR of the etalon. One approach uses a linear spectral filter for the wavelength band of interest [U.S. Pat. No. 7,505,137 B2]. Alternatively the output wavelength of a semiconductor laser can be approximated by laser operation characteristics, including current, temperature and power.

Many approaches for improving measurement sensitivity of single etalon transfer function utilize a second etalon transfer function have been proposed. In one previous work, two high finesse etalons with different FSR are used to measure the wavelength of a tunable laser. But the absolute wavelength of the tuning range is measured by a wavelength meter and the tuning range is limited by the larger FSR between two etalons. Also, the method does not allow real-time wavelength monitoring [S. Yoshida, Y. Tada, and K. Nosu, "High resolution optical spectrum analysis by coherent detection with multi-electrode DBR-LD's as local oscillators," in Conf. Proc. IMTC/94. IEEE Instrumentation Measurement Technology Conf., vol. 1, 1994, pp. 230-233].

Alternatively, the second periodic transfer function has same FSR as that of the first but with a phase shift of a fraction of FSR. Normally, two low finesse etalons with quadrature (90 degree) phase shift are used to mimic a pair of orthogonal sinusoidal response functions [U.S. Pat. No. 6,178,002 B1 and U.S. Pat. No. 7,420,686 B2]. In this method, the slope parts of one sinusoidal function cover the phase (optical wavelength or frequency) range where the other is at its maximum or minimum. The optical wavelength is then extracted from the pair of orthogonal signals. In U.S. Pat. No. 7,420,686 B2, the measurements at the maximum and minimum of the transfer functions (dead zones) are ignored. The finesse of two etalons has to be low (2 or less) to avoid dead zone overlapping and to make the etalon response relatively close to sinusoidal function. However, the very low finesse of an etalon gives a transfer function with a decreased contrast, which degrades the sensitivity due to decreased overall slope. Also, the quadrature phase shift is only optimal for a pair of etalons with this low finesse.

Furthermore, the binary method of deciding the validity of the measured signals in U.S. Pat. No. 7,420,686 B2 ignores the effect of the signal-to-noise ratio on the measurement accuracy. The accuracy is not only dependent on the slope of the etalon transfer function, but also sensitive to the noise in the signal output. The determination of the wavelength becomes less accurate when the input optical wavelength is close to the minimum of the transfer function due to both decreased slope and high relative noise. Therefore, generally, the measurement is more precise at a higher signal output (transmission or reflection) point than that of a low signal output even with a same function slope.

Accordingly, a method that optimizes the etalon finesse, relative phase shift, and wavelength algorithm based on detector sensitivity and signal-to-noise ratio so as to improve the performance of optical wavelength measurement and control is desired.

SUMMARY

According to some examples, wavelength-controlled laser systems comprise at least one laser with an output wavelength responsive to at least one tuning signal. An optical sampling device is situated to deliver a fraction of light output from at least one laser to an optical filter subsystem that produces at least one filter response signal. A control unit is configured to receive the at least one filter response signal and execute a control algorithm to generate a tuning signal that is coupled to the at least one laser so as to control the wavelength of the at least one laser. In some examples, the optical filter subsystem comprises at least 2 complementary optical etalon filters with nominally identical free spectral ranges and wherein the wavelength responses of the at least 2 complementary optical filters are offset by nominally one third of the free spectral range. In representative examples, the control algorithm also uses previously determined state information about the wavelength dependence on one or more of temperature, bias current or output power in generating the tuning signal. In other examples, the optical filter subsystem includes a coarse wavelength filter with a transmission slope or period that extends over many times the wavelength range of the etalon filters. In typical examples, the at least 2 complementary optical etalon filters are implemented by passing at least 2 optical beams through a single optical etalon at different angles. In additional embodiments, the control algorithm, in determining the tuning signal, uses a weighted combination of the filter response signals such that response signals with higher signal-to-noise ratio are weighted more heavily.

Wavelength-controlled laser systems comprise a laser with an output wavelength responsive to at least one tuning signal and an output signal tap that samples the laser output signal to provide a sampled output optical signal. An optical connection network is configured to split the sampled output optical signal and deliver at least a portion thereof to at least 2 complementary and nominally periodic optical frequency discriminators that generate complementary discriminated signals that are offset in frequency from each other by nominally one third of their period. A look-up table is included that roughly maps laser temperature, power, and drive current information to an approximate laser wavelength, and a controller is responsive to the discriminated signals and the approximate laser wavelength to generate the at least one tuning signal based on, in part, data stored in the look-up table. In some examples, the look-up table is stored in one or more computer readable storage media such as ROM or RAM. In some embodiments, the tuning signal may affect the wavelength through temperature, current, or mechanical tuning and the output signal tap samples the power from the back facet of the laser diode. In still other embodiments, the optical frequency discriminators are Fabry-Perot etalon devices and in some examples, the offset in frequency is achieved by angle tuning.

Wavelength-controlled laser system comprise a laser with an output wavelength responsive to at least one tuning signal and an optical sampling device that delivers a fraction of light output from the laser to an optical filter subsystem that is configured to provide at least one filter response signal. A control unit is configured to receive the at least one filter response signal and execute a control algorithm to generate a tuning signal that is used to control the wavelength of the laser. The optical filter subsystem comprises an optical collimating apparatus and an optical etalon filter, wherein the optical collimating apparatus functions to pass at least 2 optical beams through the optical etalon filter, each with a unique angle, such that each of the optical beams experiences an optical etalon transfer function offset by roughly ⅓ of the free spectral range. In some examples, the optical filter subsystem comprises a coarse wavelength filter with a transmission slope or period that extends over many times the wavelength range of the etalon filters.

Methods for controlling the wavelength of a tunable laser source in which the laser source is responsive to at least one tuning signal comprise delivering a fraction of the light output from the laser to an optical filter subsystem that is coupled to provide at least one filter response signal. The optical filter subsystem comprises at least 2 complementary optical etalon filters with nominally identical free spectral ranges and wherein the wavelength responses of the at least 2 complementary optical filters are offset by nominally one third of the free spectral range. At least one filter response signal is received by a control unit that executes a control algorithm to generate a tuning signal that is used to control the wavelength of the laser.

These and other features and advantages of the invention will become more apparent from the following detailed description, which proceeds with reference to the accompanying figures.

DETAILED DESCRIPTION

The invention uses an optimized algorithm to extract precise wavelength information from the combination of a course wavelength-determination method and a fine wavelength-determination method. Based on this measurement, a controller modifies one or more laser input signals in order to achieve a target wavelength.

The fine-wavelength measurer consists of two or more filters, preferably Fabry-Perot etalons, whose transmission varies periodically as a function of wavelength. The number of filters and their transfer functions are decided by the consideration of measurement performance, complexity, size, and cost. The transfer functions with same or very close free-spectral range (FSR) are preferred for easy calibration and simplicity. Low-cost, high-precision Solid and air-gap etalons made from fused-silica with a typical FSR of 25 GHz, 50 GHz, or 100 GHz are preferable choices. The etalon finesse and the FSR can be customized for different applications. The phase shift of the etalon transfer function can be achieved by precise control of the etalon thickness, incident angle, or temperature since each of these affect the length of the light traveling inside the etalon from one parallel facet to the other.

For low resolution application (e.g. larger than 100 MHz), two low finesse (2 or less) etalons with a relative phase shift between them are adequate. For resolution finer than 100 MHz, the etalons with shorter FSR can be used. However, shorter FSR is problematic for measurement over a long wavelength range. Any slight difference in FSR between the 2 etalons, which results in the relative phase difference between two transfer functions, adds up or accumulates over a large wavelength measurement range. This accumulated total phase difference over the larger total number of periods due to shorter FSR may cause the peaks of two transfer functions to walk off significantly from the targeted relative phase shift.

Compared to the low-finesse etalons used with a quadrature relative phase difference, as disclosed in the prior art, etalons with higher finesse have higher transfer function contrast (the ratio between maximum and minimum). This improves the measurement sensitivity. For low finesse etalons, the transfer function is approximately sinusoidal. For this case, offsetting 2 etalons by 90°, as is common in the prior art, is appropriate. However, an etalon with higher finesse has a non-sinusoidal response function with narrower peaks in its transmission response. In this case, the two transfer functions should be set substantially further apart in relative phase than 90° to ensure that there is no wavelength range for which the slope of transfer functions is lower than required. If necessary, more than 2 etalons may be needed to guarantee coverage of the full wavelength range with high sensitivity.

Figure 1:
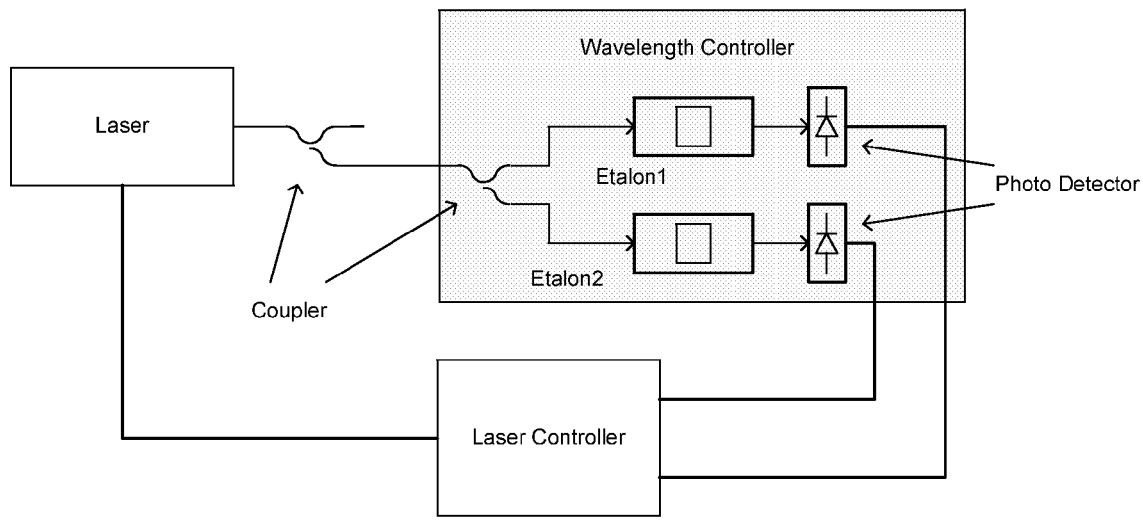
FIG. 1 is a block diagram schematic illustrating the functional blocks of a preferred embodiment of the invention.
Figure 2:
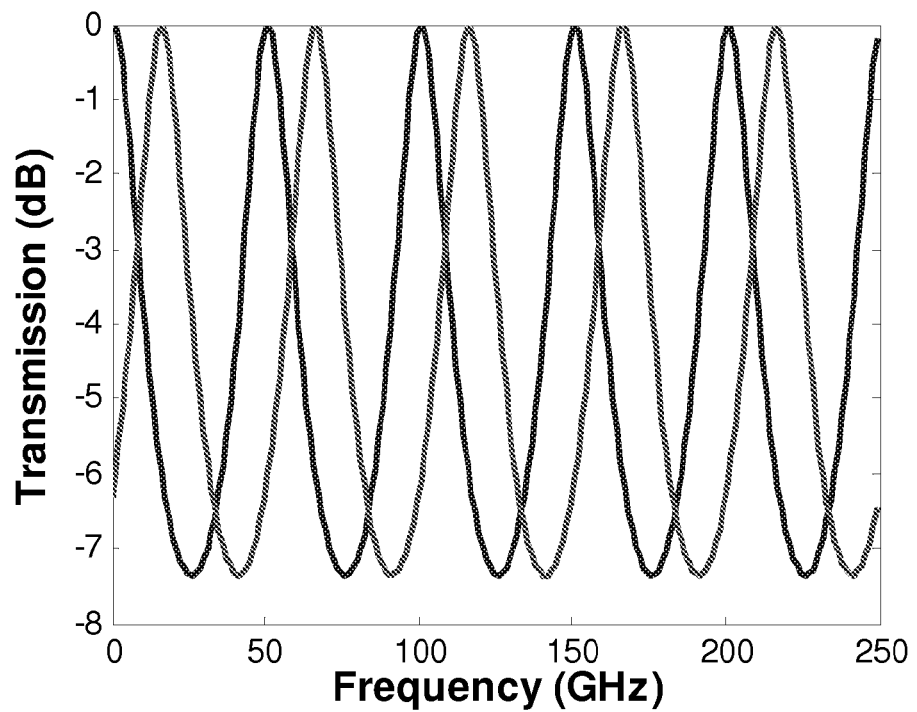
FIG. 2 is a representative illustration of the transfer function of 2 complementary optical etalon filters, in accordance with the present invention.

In one embodiment, two Fabry-Perot etalons, similar to those used in DWDM wavelength lockers, are used to obtain precise frequency measurements, as seen in FIG. 1. A portion of the output of the laser to be controlled is diverted to the wavelength controller through, for example, a fiber coupler. In the wavelength controller, this signal is split using another fiber coupler between the two etalons. Each of the etalons has approximately the same free-spectral range (FSR) and a finesse of 3.4, corresponding contrast of 7.5 dB, and the two are offset from each other by 120°, as shown in FIG. 2. This ensures that the regions of the steepest slope in the response function of one etalon correspond to the near-zero-slope regions in the other etalon. The transmitted light from each etalon is measured with a photo-detector. By analyzing the output signals from the two detectors, and considering these values along with known predetermined properties of the laser (as described below) based on, for example current and temperature, and contained in a stored look-up table, a precise measure of the laser wavelength can be determined.

While 120° is close to optimal for the example described above, it is understood that performance is a weak function of that offset around 120°. Offset values within roughly plus or minus 10-20° are not likely to introduce significant penalties. In implementation, we would attempt to optimize the accuracy of wavelength measurement in the vicinity of 120° for a particular design wavelength, for example in the center of the band intended operation. The exact offset would generally depend on the exact operational wavelength relative to this design frequency, due to imperfections in the in the filters and wavelength dependencies of the optical properties of the filter material. In all cases, operation is qualitatively different from the prior art using filters with low finesse at quadrature or nominally 90° offsets. As used herein two optical filters with substantially the same period (for Fabry-Perot etalons, the same Free Spectral Range (FSR)) are referred to as "complementary." As noted above, such filters can be configured to have various frequency offsets of anywhere between 0 and 1 FSR, but the particular complementary filters disclosed herein have frequency offsets of about ⅓ FSR, i.e., have offsets in a range of about 120°±20°.

The above dual-etalon system allows for precise frequency measurements to be obtained. Due to the periodicity (e.g., 50 GHz) of the etalons, however, there is ambiguity as to the absolute wavelength. To resolve this ambiguity, we predetermine an approximate relationship between the "state" of the laser and the wavelength, where the state can include, temperature, power, and current characteristics. A representation of this relationship is determined by prior calibration and stored in the controller. This representation may be a look-up table or an appropriately parameterized mathematical function or a combination of the two. By comparison to this stored characterization data, one can obtain a rough approximation of the laser wavelength. As long as the resolution of this approximation should be better than the FSR of each of the etalons, the frequency estimate allows one to determine which FSR of each etalon is in use, thus resolving ambiguity associated with the periodicity of the etalons' transfer functions. In this manner we retain the precision associated with operating with a wavelength filter that has a steep slope, while extending the tuning over a broad range.

In order to obtain a wavelength estimate, one must determine the fraction of power transmitted through each etalon. In one embodiment, this can be achieved by placing an additional coupler (i.e., splitter) before each etalon, and directing one output to the etalon and the other output to another photodetector. Comparison of the two detected power values gives the transmission ratio of the etalon which can then be compared to the stored transfer function. In another embodiment, the part of the input of the wavelength controller is diverted by coupler (splitter) to a photodetector to monitor the input optical power. In another embodiment, the input optical power of the wavelength controller is monitored by an in-line power meter. In another embodiment, one can use the back-face monitor (monitor photodiode current) of the laser to measure the output power of the laser. Based on the loss characteristics of each element in the optical circuit, one can compute an estimate of the power entering each etalon, thereby allowing for the fraction of power transmitted through the etalon to be obtained. In yet another embodiment, one can place an optical circulator immediately before each etalon so that the reflected power of the etalon can be measured, thereby allowing for the ratio of transmitted power to be obtained.

Figure 3:
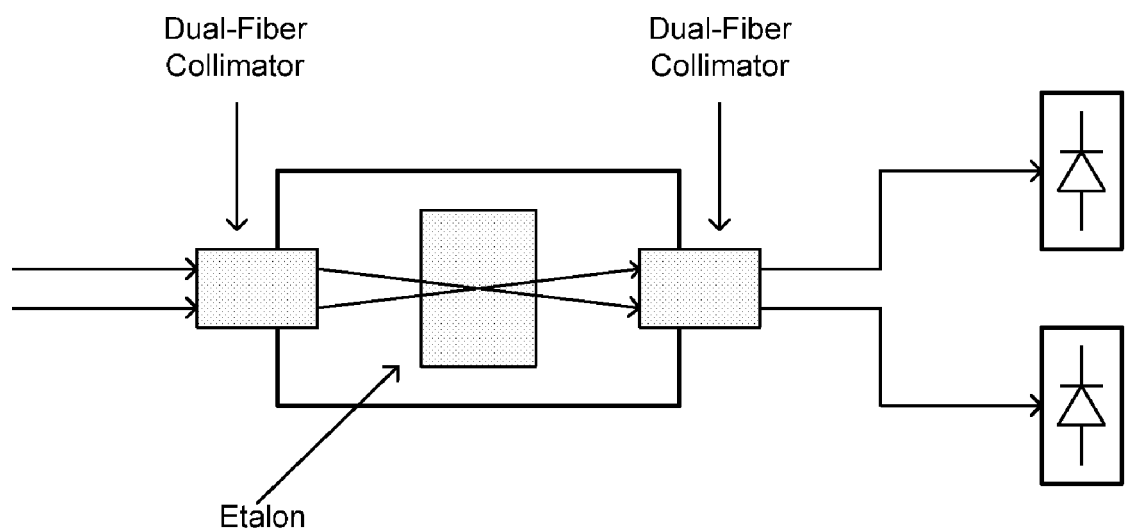
FIG. 3 is a block diagram schematic illustrating a preferred embodiment of the invention.

Because the multiple etalon response functions are shifted by a fraction of a period with respect to each other, one can also obtain a frequency estimate by examining the ratio of the transmitted powers of each etalon. These multiple transfer functions can be obtained by multiple etalons with slight different thicknesses or the same thicknesses but with different angles of optical beam incidence or precisely controlled temperature difference among etalons. In a preferred approach, a single etalon is used to filter multiple component beams. In this design, the temperature drift affects all transfer functions in the same fashion such that the relative phase differences among them stay the same. Thus, complex temperature control is avoided. The measurement error due to temperature can be compensated by calibrating the temperature response of the etalon and including this in the computation algorithm. In one embodiment, shown in FIG. 3, a dual-fiber collimator diverts two optical beams with a small crossing angle of 2.4° to the same etalon shown in FIG. 1. A corresponding dual-fiber collimator couples the transmitted beams to two photodiodes. The etalon response similar to FIG. 2 is obtained by the preset angle offset of the etalon. Neither input beam is at normal incidence, which prevents cavity effects due to coupling reflected beam back into the input collimator. In another embodiment, the angle of the etalon can be tilted to tune the relative phase difference between two transmission responses.

For a single etalon, if one obtains an estimate of the fraction of power that was transmitted through the etalon, one can compare this to the stored etalon-transfer-function information in order to obtain an estimate of the frequency. Each etalon allows for an independent estimate of the frequency. The accuracy of the estimate is related to the accuracy of the current measurement from the photodiode. In regions where the etalon transfer function in steepest, one may obtain more accurate measurements of frequency. The accuracy of the estimate is also affected by noise, for example noise induced by photodiodes and following circuitry, and quantization error in data digitization. Normally, one may obtain more accurate measurement at the higher signal output range of the transfer function. In the embodiment of the invention, the frequency is estimated by computing a weighted average of the wavelength estimates from each etalon, where each weight used is a function of the confidence/accuracy of its corresponding estimate. For example, one could empirically or analytically compute the variance of the uncertainty of each wavelength estimate. This could be done by taking a large number of measurements and empirically computing the variance of the data set, or this could be done analytically based on an understanding of the noise and quantization error in the system. Based on this variance estimate, one could then obtain a maximum-likelihood estimate of the actual wavelength by using as a weighting function equal to the inverse of the uncertainty (i.e., variance) of each of the individual etalon estimates.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims and their equivalents. We therefore claim as our invention all that comes within the scope and spirit of these claims.

We claim:

1. A wavelength-controlled laser system comprising:
    a laser with an output wavelength responsive to at least one tuning signal,
    an optical sampling device configured to deliver a fraction of light output from the laser to an optical filter subsystem, said optical filter subsystem capable of outputting at least one filter response signal,
    a control unit configured to receive said at least one filter response signal and execute a control algorithm to generate a tuning signal that is used to control the wavelength of the laser, wherein said control algorithm, in determining the tuning signal, uses a weighted combination of the at least one filter response signals such that response signals with higher signal-to-noise ratio are weighted more heavily; and
    wherein the optical filter subsystem comprises at least one periodic optical frequency discriminator that is configured to provide at least first and second complementary optical filter outputs associated with discriminator transfer functions that are spectrally offset.

2. The system of claim 1, wherein said control algorithm also uses previously determined state information about the wavelength dependence on temperature, bias current or output power in generating the tuning signal.

3. The system of claim 1, wherein
    said optical filter subsystem further comprises a coarse wavelength filter with the transmission slope or period that extends over many times the wavelength range of said at least one periodic optical frequency discriminator.

4. The system of claim 1, wherein
    the at least one periodic optical frequency discriminator is configured to provide the at least first and second complementary optical filter outputs by directing associated optical beams through a single optical etalon at different angles.

5. A method for controlling the wavelength of a tunable laser source, in which the laser source is responsive to at least one tuning signal, the method comprising
    delivering a fraction of the light output from the laser to an optical filter subsystem, said optical filter subsystem capable of outputting at least one filter response signal, and wherein the optical filter subsystem comprises at least one optical etalon filter configured to provide at least first and second wavelength responses that are offset,
    receiving said at least one filter response signal in a control unit, and
    executing a control algorithm to generate a tuning signal that is used to control the wavelength of the laser, wherein said control algorithm, in determining the tuning signal, uses a weighted combination of the at least one filter response signal such that response signals with higher signal-to-noise ratio are weighted more heavily.

6. The method of claim 5, wherein
    said control algorithm also uses previously determined state information about the wavelength dependence on temperature, bias current or output power in generating the tuning signal.

7. The method of claim 5, wherein
    said optical filter subsystem further comprises a coarse wavelength filter with the transmission slope or period that extends over many times the wavelength range of said etalon filter.

8. The method of claim 5, wherein
    the first and second wavelength responses are obtained by passing associated optical beams through the at least one optical etalon filter at different angles.

9. The wavelength-controlled laser system of claim 1, wherein the spectral offset is about one third of a period of the at least one periodic optical frequency discriminator.

10. The wavelength-controlled laser system of claim 9, wherein the optical filter subsystem further comprises a coarse wavelength filter with the transmission slope or period that extends over many times the wavelength range of the at least one periodic optical frequency discriminator.

11. The wavelength-controlled laser system of claim 1, wherein the optical filter subsystem comprises at least 2 periodic optical frequency discriminators with nominally identical periods configured to produce the first and second complementary optical filter outputs, respectively, and wherein the wavelength responses of the at least 2 periodic optical frequency discriminators are offset by nominally one third of the period.

12. The wavelength-controlled laser system of claim 11, wherein the periodic optical frequency discriminators are etalon filters and the identical period corresponds to a free spectral range.

13. The method of claim 5, wherein the at least first and second wavelength responses are offset by nominally one third of the free spectral range.

14. The method of claim 5, wherein the optical filter subsystem comprises first and second complementary optical etalon filters with nominally identical free spectral ranges offset by nominally one third of the free spectral range, wherein the first and second wavelength responses are obtained from the first and second complementary optical filters, respectively.

* * * * *